United States Patent [19]

Chieli

[11] Patent Number: 4,827,207

[45] Date of Patent: May 2, 1989

[54] LINEAR LOAD CURRENT MEASUREMENT CIRCUIT

[75] Inventor: Davide Chieli, Milan, Italy

[73] Assignee: SGS-Thomson Microelectronics S.r.l., Milan, Italy

[21] Appl. No.: 131,351

[22] Filed: Dec. 4, 1987

[30] Foreign Application Priority Data

Dec. 17, 1986 [IT] Italy .............................. 22732 A/86

[51] Int. Cl.⁴ .............................................. G05F 3/16
[52] U.S. Cl. ..................................... 323/316; 323/315
[58] Field of Search ........................ 323/315, 316, 317

[56] References Cited

U.S. PATENT DOCUMENTS

| | | | |
|---|---|---|---|
| 4,251,743 | 2/1981 | Harayama | 323/316 |
| 4,319,181 | 3/1982 | Wrathall | 323/315 |
| 4,553,084 | 11/1985 | Wrathall | 323/316 |
| 4,599,554 | 7/1986 | Jaycox et al. | 323/317 |

FOREIGN PATENT DOCUMENTS 0219682  4/1987  European Pat. Off. .
2071951  9/1981  United Kingdom .
2149517  6/1985  United Kingdom .

OTHER PUBLICATIONS

Fay; "Current-Mirror FETs Cut Costs and Sensing Losses"; EDN; Sep. 4, 1986.

Primary Examiner—Patrick R. Salce
Assistant Examiner—Sterrett
Attorney, Agent, or Firm—Rosen, Dainow & Jacobs

[57] ABSTRACT

A circuit for the linear measurement of a current flowing through a load which comprises a current sensor consisting of a resistor, and a first driver transistor connected to the load and a second transistor connected to the resistor, both transistors being field effect transistors interconnected into a current mirror configuration, which includes an operational amplifier having its inputs respectively connected to the drain electrodes of the first and second transistors to regulate the drain-source voltage of the transistors and enable linear measurement of the load current irrespective of the operating temperature.

8 Claims, 1 Drawing Sheet

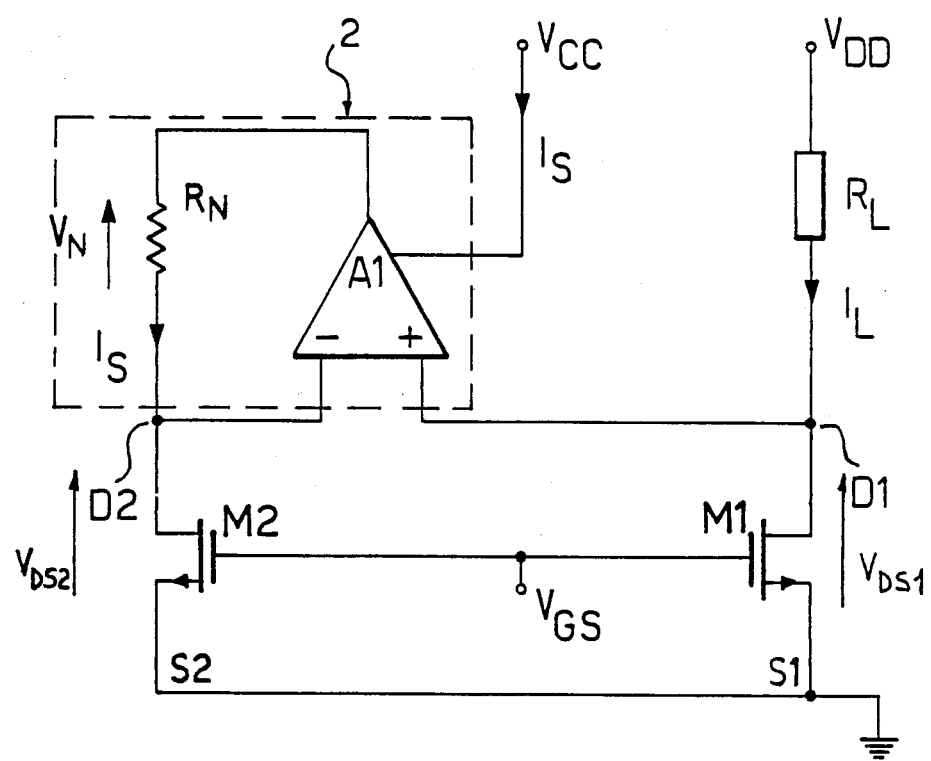

LINEAR LOAD CURRENT MEASUREMENT CIRCUIT

BACKGROUND OF THE INVENTION

This invention relates to a circuit for the linear measurement of a current flowing through a load, of a type which comprises a current sensor, and a first driver transistor connected to the load and a second transistor connected to said current sensor, both said transistors being field effect transistors and interconnected into a current mirror configuration.

As is known, circuits of the above-noted type find application to a variety of devices for measuring and controlling a current flowing through a load, such as current regulators and limiters for a current supplied to an electric motor, which will be referred to hereinafter as resistive load $R_L$.

A current flowing through the load $R_L$ is usually measured indirectly by measuring the voltage drop $V_S$ across a resistor $R_S$ connected to the load serially.

In this respect, a first known technical approach consists of driving the load current $I_L$ through a field effect driver transistor, such as a MOSFET, having its drain electrode connected to the load $R_L$ and its source electrode connected to ground through the resistor $R_S$.

However, this first approach has the drawback that a power is dissipated across the resistor $R_S$ which is equal to the voltage drop $V_S$ multiplied by the load current $I_L$.

The prior art proposes a second approach in order to obviate the drawback and restricting the power dissipation while ensuring a reliable measurement.

The second prior approach consists of providing a measuring circuit which comprises a pair of field effect transistors of either the MOSFET or its equivalent JFET types, connected to each other into a current mirror configuration. In particular, the first and second transistors which make up the above-noted pair have their respective drain electrodes connected to the load $R_L$ and their respective gate electrodes connected together. Further, whereas the first transistor is a driver transistor and has its source electrode connected directly to ground, the second transistor has its source electrode grounded through the current sensing resistor $R_S$.

Furthermore, by making the second transistor with an area which is n times smaller than that of the first transistor, it would be possible to flow through the drain of the second transistor, and hence the resistor $R_S$, a current $I_S$ which is n+1 times smaller than the load current $I_L$. The power dissipated across the resistor $R_S$ would then be n+1 times smaller than that dissipated with the former known technical approach.

However, that possibility is hindered in that the presence of the resistor $R_S$ makes the values unequal of the gate-source and drain-source voltages of the transistors which are in different operating conditions. As a result, the serious problem is encountered that the value of the n parameter, indicating the current mirror ratio for the transistor pair, is made dependent on the value of the voltage drop $V_S$ tied, in turn, to the load current $I_L$ as well as to temperature, as related in the EDN scientific magazine issue of Sept. 4, 1986.

Thus, the measurement of the load current $I_L$ turns out to be non-linear and dependent on the operating temperature.

BRIEF SUMMARY OF INVENTION

The technical problem underlying this invention is to provide a circuit for linearly measuring a current flowing through a load, which has such structural and operative features as to afford reduced power dissipation in carrying out the measurement, while also obviating the above-noted drawbacks.

This problem is solved by a circuit as indicated being characterized in that it comprises a voltage regulator connected electrically to respective drain electrodes of the first and second transistors to maintain across either transistors the same values of drain-source voltage.

DESCRIPTION OF DRAWING

The features and advantages of the measuring circuit according to the invention will become more clearly apparent from the following detailed description of an exemplary embodiment thereof, to be taken by way of illustration and not of limitation in conjunction with the accompanying drawing which shows a schematic diagram of a circuit for the linear measurement of a current according to this invention.

DETAILED DESCRIPTION OF PREFERRED EMBODIMENT

The drawing shows comprehensively in a schematic form, a circuit for the linear measurement of a current $I_L$ flowing through a load, in accordance with this invention.

The load is conventionally represented by a resistor $R_L$ having one end connected to a power supply pole $V_{DD}$.

The circuit comprises a first field-effect driver transistor M1, specifically of the N channel MOSFET type, which has its drain electrode D1 connected to the other end of the resistor $R_L$.

A second field effect transistor M2, also of the MOSFET type, is connected to the first transistor into a so-called current mirror configuration, wherein the second transistor M2 is connected to a current sensor consisting of a resistor $R_N$ as explained hereinafter.

More specifically, the transistor M1 and M2 have their respective gate electrodes G1 and G2 connected together, whereas their source electrodes S1 and S2 are connected to each other and to ground.

Each gate, G1 and G2, of the transistors M1 and M2 is therefore supplied the same voltage $V_{GS}$.

A voltage regulator 2 is advantageously connected to the drain electrode D1 and D2 of the transistors M1 and M2, to maintain at such electrodes a value of drain-source voltage $V_{DS}$ which is the same for both transistors.

The voltage regulator 2 comprises an operational amplifier A1 having its inverting input connected to the drain D2 of the second transistor M2 and its non-inverting input connected to the drain D1 of the first transistor M1.

Said operational amplifier A1 is supplied a voltage $V_{CC}$ which is lower than the power supply voltage $V_{DD}$. Further, the operational amplifier A1 has its output connected to the drain D2 of the second transistor M2 through the resistor $R_N$.

The circuit shown is implemented as a monolithic circuit, and the second transistor M2 is made with an area which is n times smaller than the area of the first transistor M1.

With the circuit in operation, a load current $I_L$ would be flowed through the load $R_L$, and a current $I_S$ is flowed through the resistor $R_N$, a voltage drop $V_N$ occurring across said resistor.

The presence of the voltage regulator 2, consisting of the operational amplifier A1, requires that the drain-source voltages $V_{DS1}$ and $V_{DS2}$ have the same value for both transistors. Accordingly, since the transistors M1 and M2 have also the same gate-source voltage $V_{GS}$, these would be in the same condition of operation.

As it is further possible to achieves area ratios equal to n between the first and second transistors, where n is greater than 1,000, it follows that the value of the current $I_S$ will be n times smaller than the value of the load current $I_L$ at any time of its operation.

In the measuring circuit of this invention, the source S2 of the second transistor M2 is connected directly to ground, and there is no voltage drop thereon, in comparison with prior circuits in which a voltage drop $V_S$ occurs on the source S2. Thus, in the inventive circuit, the value of that voltage drop $V_S$ no longer conditions the n parameter of the current mirror, and the current measurement is made independent of temperature and of the value of the load current $I_L$ itself.

In conclusion, the power dissipated to the measurement is given by the supply voltage $V_{CC}$ multiplied by the current $I_S$ flowing through the resistor $R_N$, and by controlling both the value of $V_{CC}$ and the n ratio of the current mirror, it becomes possible to minimize such dissipation.

The circuit of this invention has the great advantage that it affords a specially accurate measurement of the load current $I_L$ which is unaffected by the operating conditions. Furthermore, this circuit affords great energy savings in carrying out the measurement and is specifically adapted to be implemented as a monolithic IC.

I claim:

1. A circuit for the linear measurement of a current flowing through a load, for the linear measurement of a current sensor, and a first driver transistor connected to the load and a second transistor connected to said current sensor, both said transistors being field effect transistors and interconnected into a current mirror configuration, characterized in that it comprises a voltage regulator connected electrically to respective drain electrodes of the first and second transistors to maintain across both transistors the same values of drain-source voltage.

2. A circuit according to claim 1, characterized in that said voltage regulator is an operational amplifier having its inputs respectively connected to the drain electrodes of said first and said second transistors and its output connected to the drain of the second transistor through said current sensor.

3. A circuit according to claim 1, characterized in that said current sensor consists of a resistor.

4. A circuit according to claim 1 or 2, characterized in that the inverting input of said amplifier (A1) is connected to said drain electrode of the second transistor.

5. A linear load-current measuring circuit comprising:
   a first driver field effect transistor having source, drain and gate electrodes and connected to the load,
   a current sensor,
   a second field effect transistor having source, drain and gate electrodes and connected to said current sensor,
   means for interconnecting said first and second transistors in a current mirror circuit arrangement, and
   means connected to the first and second transistors for maintaining the same values of drain-source voltage across both transistors.

6. A circuit as set forth in claim 5 wherein the gate and source electrodes of the first and second transistors are commonly connected.

7. A circuit as set forth in claim 6 wherein the common source connection is grounded.

8. A circuit as claimed in claim 7 wherein the means for maintaining comprises an operational amplifier having an inverting input connected to the second transistor drain electrode and a non-inverting input connected to the first transistor drain electrode, and an output connected to the current sensor.

* * * * *

UNITED STATES PATENT AND TRADEMARK OFFICE
CERTIFICATE OF CORRECTION

PATENT NO. : 4,827,207
DATED : May 2, 1989
INVENTOR(S) : DAVID CHIELI

It is certified that error appears in the above-identified patent and that said Letters Patent is hereby corrected as shown below:

Column 3, line 40, delete "for the linear measurement of" and insert --of a type which comprises--.

Signed and Sealed this

Thirteenth Day of October, 1992

*Attest:*

DOUGLAS B. COMER

*Attesting Officer*  *Acting Commissioner of Patents and Trademarks*